US012772583B2

(12) United States Patent
Lee et al.

(10) Patent No.: US 12,772,583 B2
(45) Date of Patent: Oct. 20, 2026

(54) CHIP PACKAGE AND MANUFACTURING METHOD THEREOF

(71) Applicant: Xintec Inc., Taiwan (TW)

(72) Inventors: Po-Han Lee, Taipei City (TW); Tsang Yu Liu, Zhubei City (TW); Chia-Ming Cheng, New Taipei City (TW); Kuei Wei Chen, Taoyuan City (TW); Jiun-Yen Lai, Taoyuan City (TW)

(73) Assignee: Xintec Inc., Taoyuan City (TW)

( * ) Notice: Subject to any disclaimer, the term of this patent is extended or adjusted under 35 U.S.C. 154(b) by 547 days.

(21) Appl. No.: 18/312,552

(22) Filed: May 4, 2023

(65) Prior Publication Data

US 2023/0369362 A1 Nov. 16, 2023

Related U.S. Application Data

(60) Provisional application No. 63/342,088, filed on May 14, 2022.

(51) Int. Cl.

| | |
|---|---|
| ***H10F 39/00*** | (2025.01) |
| *H10W 72/00* | (2026.01) |
| *H10W 72/30* | (2026.01) |
| *H10W 90/00* | (2026.01) |

(52) U.S. Cl.

CPC ......... *H10F 39/804* (2025.01); *H10F 39/026* (2025.01); *H10W 72/0198* (2026.01); *H10W 72/07353* (2026.01); *H10W 72/07354* (2026.01); *H10W 72/07554* (2026.01); *H10W 72/331* (2026.01); *H10W 72/337* (2026.01); *H10W 72/347* (2026.01); *H10W 72/354* (2026.01); *H10W 72/865* (2026.01); *H10W 72/884* (2026.01); *H10W 90/734* (2026.01); *H10W 90/754* (2026.01)

(58) Field of Classification Search

CPC ........................................................ H10F 39/804

See application file for complete search history.

(56) References Cited

U.S. PATENT DOCUMENTS

| | | | | |
|---|---|---|---|---|
| 2011/0156188 | A1* | 6/2011 | Tu | H10F 39/804 257/E31.127 |
| 2012/0228503 | A1 | 9/2012 | Nishikawa et al. | |
| 2013/0012276 | A1 | 1/2013 | Coffy et al. | |
| 2024/0339484 | A1* | 10/2024 | Shim | H01L 24/29 |

FOREIGN PATENT DOCUMENTS

| | | | |
|---|---|---|---|
| TW | 201347219 | A | 11/2013 |
| TW | 202002187 | A | 1/2020 |
| TW | 202101690 | A | 1/2021 |
| TW | 202109788 | A | 3/2021 |

* cited by examiner

*Primary Examiner* — Yu-Hsi D Sun
(74) *Attorney, Agent, or Firm* — LIU & LIU

(57) ABSTRACT

A chip package includes a carrier board, a chip, a light transmissive sheet, a supporting element, and a molding material. The chip is located on the carrier board and has a sensing area. The light transmissive sheet is located above the supporting element and covers the sensing area of the chip. The supporting element is located between the light transmissive sheet and the chip, and surrounds the sensing area of the chip. The molding material is located on the carrier board and surrounds the chip and the light transmissive sheet. A top surface of the molding material is lower than a top surface of the light transmissive sheet.

16 Claims, 11 Drawing Sheets

100

100

100a

CHIP PACKAGE AND MANUFACTURING METHOD THEREOF

CROSS-REFERENCE TO RELATED APPLICATIONS

This application claims priority to U.S. Provisional Application Ser. No. 63/342,088, filed May 14, 2022, which is herein incorporated by reference.

BACKGROUND

Field of Invention

The present disclosure relates to a chip package and a manufacturing method of the chip package.

Description of Related Art

Image sensors are devices that convert optical signals into electrical signals. Currently, the types of image sensors commonly used include charge coupled device (CCD) and complementary metal-oxide semiconductor (CMOS). Complementary metal-oxide semiconductor image sensors (CIS) have the characteristics of low cost, low power consumption, small size and high integration, and are widely used in many fields such as mobile phones, automobiles, security control, medical treatment, etc.

When manufacturing the chip package of an image sensor, the diced image sensor chip is usually bonded to a carrier board, and then the cut glass sheet is placed on the image sensor chip, and a wire bonding process and a molding process are performed in sequence. However, the aforementioned steps are performed in chip-scale packaging, and it will take a lot of time to bond a large number of chips and glass sheets one by one, and the chips are easily contaminated, such that product yield is difficult to improve. In addition, because the coefficient of thermal expansion (CTE) of a molding material does not match a glass sheet, the molding material generally covering the entire sidewall of the glass sheet is easy to cause the glass sheet to break.

SUMMARY

One aspect of the present disclosure provides a chip package.

According to some embodiments of the present disclosure, a chip package includes a carrier board, a chip, a light transmissive sheet, a supporting element, and a molding material. The chip is located on the carrier board and has a sensing area. The light transmissive sheet is located above the supporting element and covers the sensing area of the chip. The supporting element is located between the light transmissive sheet and the chip, and surrounds the sensing area of the chip. The molding material is located on the carrier board and surrounds the chip and the light transmissive sheet. A top surface of the molding material is lower than a top surface of the light transmissive sheet.

In some embodiments, a top of an edge of the molding material is lower than a position of half a thickness of the light transmissive sheet.

In some embodiments, a thickness of the light transmissive sheet is in a range from 50 μm to 1000 μm, and a thickness of the supporting element is in a range from 40 μm to 250 μm.

In some embodiments, a sidewall of a top portion of the light transmissive sheet has a protruding portion extending in a horizontal direction, and the molding material extends to a bottom surface of the protruding portion.

In some embodiments, a corner of a top portion of the chip has a concave portion, and the molding material extends to the concave portion.

In some embodiments, an outer sidewall of the supporting element is recessed in a sidewall of the light transmissive sheet.

In some embodiments, an outer sidewall of the supporting element is aligned with a sidewall of the light transmissive sheet in a vertical direction.

In some embodiments, a top portion of an outer sidewall of the supporting element is aligned with a sidewall of the light transmissive sheet in a vertical direction, and a bottom portion of the outer sidewall of the supporting element protrudes from the sidewall of the light transmissive sheet.

In some embodiments, an entire outer sidewall of the supporting element protrudes from a sidewall of the light transmissive sheet.

In some embodiments, the carrier board has a conductive pad, the chip has a contact electrically connected to the conductive pad of the carrier board by a conductive wire, and the conductive wire is located in the molding material.

Another aspect of the present disclosure provides a manufacturing method of a chip package.

According to some embodiments of the present disclosure, a manufacturing method of a chip package includes forming a supporting element having a grip shape on a light transmissive sheet; forming a temporary bonding layer covering the light transmissive sheet; cutting the light transmissive sheet and the supporting element along the supporting element to form a plurality of trenches; bonding the supporting element to a wafer such that the supporting element is located between the light transmissive sheet and the wafer and surrounds a plurality of sensing areas of the wafer; removing the temporary bonding layer; cutting the wafer along the trenches to form a plurality of chips; bonding one of the chips on a carrier board; and forming a molding material on the carrier board, wherein the molding material surrounds said chip on the carrier board and the light transmissive sheet, and a top surface of the molding material is lower than a top surface of the light transmissive sheet.

In some embodiments, forming the molding material on the carrier board is performed such that a top of an edge of the molding material is lower than a position of half a thickness of the light transmissive sheet.

In some embodiments, the manufacturing method of the chip package further includes flipping a combination of the light transmissive sheet, the supporting element, and the temporary bonding layer after the trenches is formed and before the supporting element is bonded to the wafer, such that the temporary bonding layer is above the light transmissive sheet, and the supporting element is below the light transmissive sheet.

In some embodiments, cutting the light transmissive sheet and the supporting element along the supporting element includes cutting, by a first cutting tool, a portion of the light transmissive sheet; and cutting, by a second cutting tool, another portion of the light transmissive sheet and the supporting element, wherein a width of the second cutting tool is greater than a width of the first cutting tool, such that a sidewall of the light transmissive sheet has a protruding portion extending in a horizontal direction.

In some embodiments, forming the molding material on the carrier board is performed such that the molding material extends to a bottom surface of the protruding portion.

In some embodiments, cutting the wafer along the trenches to form the chips includes cutting, by a first cutting tool, a top portion of the wafer; and cutting, by a second cutting tool, a bottom portion of the wafer, wherein a width of the second cutting tool is less than a width of the first cutting tool, such that a corner of a top portion of each of the chips has a concave portion.

In some embodiments, cutting the light transmissive sheet and the supporting element along the supporting element includes cutting, by a first cutting tool, the light transmissive sheet; and cutting, by a second cutting tool, the supporting element, wherein a width of the second cutting tool is greater than a width of the first cutting tool, such that an outer sidewall of the supporting element is recessed in a sidewall of the light transmissive sheet.

In some embodiments, cutting the light transmissive sheet and the supporting element along the supporting element includes cutting, by a first cutting tool, the light transmissive sheet and a portion of the supporting element; and cutting, by a second cutting tool, another portion of the supporting element, wherein a width of the second cutting tool is less than a width of the first cutting tool, such that a top portion of an outer sidewall of the supporting element is aligned with a sidewall of the light transmissive sheet in a vertical direction, and a bottom portion of the outer sidewall of the supporting element protrudes from the sidewall of the light transmissive sheet.

In some embodiments, cutting the light transmissive sheet and the supporting element along the supporting element includes cutting, by a first cutting tool, the light transmissive sheet; and cutting, by a second cutting tool, the supporting element, wherein a width of the second cutting tool is less than a width of the first cutting tool, such that an entire outer sidewall of the supporting element protrudes from a sidewall of the light transmissive sheet.

In some embodiments, the manufacturing method of the chip package further includes after bonding one of the chips on the carrier board, electrically connecting a conductive wire to a contact of the chip on the carrier board and a conductive pad of the carrier board by wire bonding, wherein after the molding material is formed on the carrier board, the conductive wire is located in the molding material.

In the aforementioned embodiments of the present disclosure, during the manufacturing method of the chip package, the light transmissive sheet is covered by the temporary bonding layer, and then the light transmissive sheet and the supporting element are cut along the supporting element, and then the supporting element is bonded to the wafer. Therefore, the wafer can be cut along the trenches to form the chips, thereby realizing wafer-level packaging for bonding the light transmissive sheet to the chips. As a result, process time can be saved, and the sensing area of the chip is prevented from being polluted to improve product yield. In a subsequent process, the chip can be bonded to the carrier board, and the amount of the molding material can be controlled to form on the carrier board such that the top surface of the molding material is lower than the top surface of the light transmissive sheet. Such a configuration can reduce the influence of the mismatch of the coefficient of thermal expansion (CTE) between the light transmissive sheet and the molding material, thereby preventing the light transmissive sheet from cracking due to temperature during manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
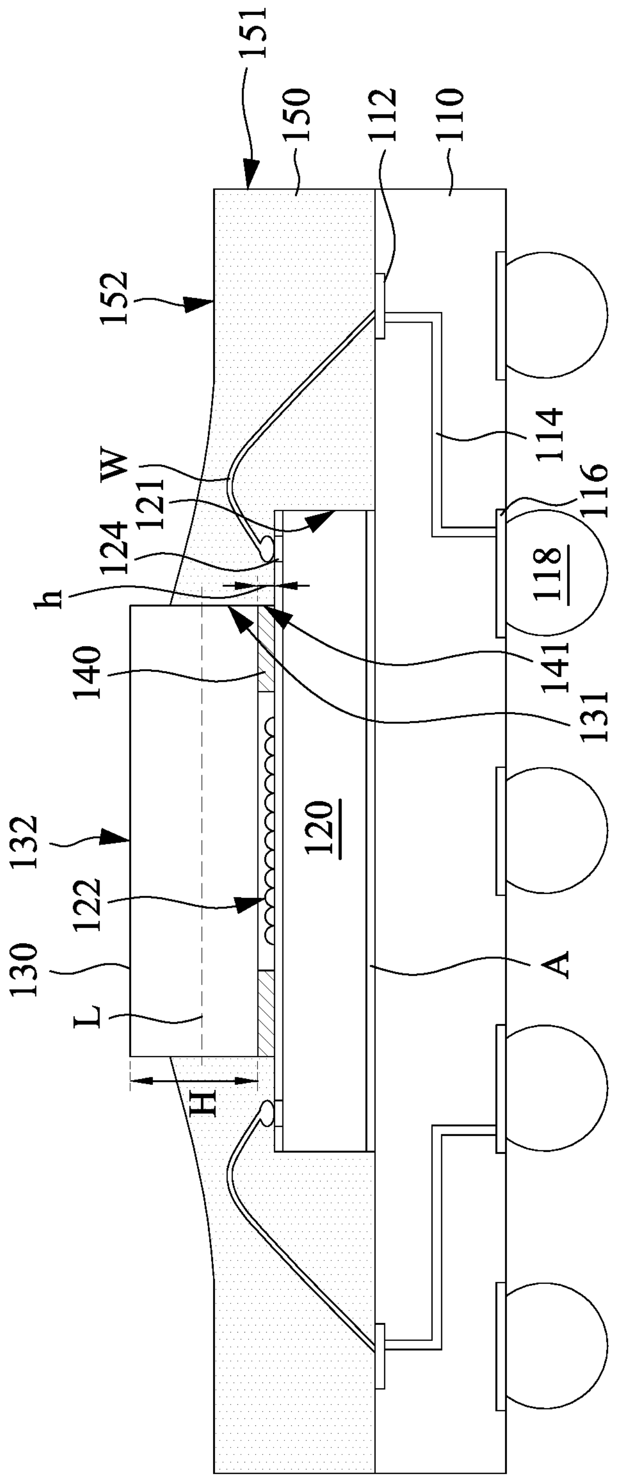
FIG. 1 is a cross-sectional view of a chip package according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a chip package 100 according to one embodiment of the present disclosure. The chip package 100 includes a carrier board 110, a chip 120, a light transmissive sheet 130, a supporting element 140, and a molding material 150. The chip 120 is located on the carrier board 110 and has a sensing area 122. The light transmissive sheet 130 is located above the supporting element 140 and covers the sensing area 122 of the chip 120. Light may pass through the light transmissive sheet 130, and the light transmissive sheet 130 can protect the sensing area 122. The supporting element 140 is located between the light transmissive sheet 130 and the chip 120, and surrounds the sensing area 122 of the chip 120. The molding material 150 is located on the carrier board 110 and surrounds the chip 120 and the light transmissive sheet 130, in which a top surface 152 of the molding material 150 is lower than a top surface 132 of the light transmissive sheet 130. The molding material 150 may be in direct contact with a sidewall 121 of the chip 120, an outer sidewall 141 of the supporting element 140, and a sidewall 131 of the light transmissive sheet 130.

In this embodiment, the chip 120 may be an image sensor, such as a complementary metal-oxide semiconductor (CMOS), and the sensing area 122 may be an image sensing area. The material of the light transmissive sheet 130 may be glass, and the material of the supporting element 140 may be epoxy, but the present disclosure is not limited in this regard. The carrier board 110 may have conductive pads 112 and 116, a circuit 114, and a conductive structure 118. The circuit 114 may be electrically connected to the conductive pads 112 and 116. The conductive pad 112 is configured to electrically connect to the chip 120. The conductive structure 118 is electrically connected to the conductive pad 116, and is configured to electrically connect to another electronic component (e.g., a system PCB).

Specifically, since the amount of the molding material 150 has been specially designed, the top surface 152 of the molding material 150 can be lower than the top surface 132 of the light transmissive sheet 130 after the molding material 150 is formed on the carrier board 110. Compared with a tradition configuration, the height of the top surface 152 of the molding material 150 is reduced by 20% to 50%. Such a configuration can electively reduce the influence of the mismatch of the coefficient of thermal expansion (CTE) between the light transmissive sheet 130 and the molding material 150, thereby preventing the light transmissive sheet 130 from cracking due to temperature during manufacturing processes.

In some embodiments, the top of an edge 151 of the molding material 150 is lower than the position of half a thickness H of the light transmissive sheet 130 (i.e., lower than the position of a dotted line L). The thickness H of the light transmissive sheet 130 may be in a range from 50 μm to 1000 μm. A thickness h of the supporting element 140 is in a range from 40 μm to 250 μm. The outer sidewall 141 of the supporting element 140 is aligned with the sidewall 131 of the light transmissive sheet 130 in a vertical direction. Moreover, the chip 120 may be bonded to the carrier board 110 by an adhesive layer A, and the chip 120 has a contact 124. The contact 124 can be electrically connected to the conductive pad 112 of the carrier board 110 by a conductive wire W, such as performing a wire bonding process. In addition, the conductive wire W is located in the molding material 150.

It is to be noted that the connection relationships, the materials, and the advantages of the elements described above will not be repeated in the following description. In the following description, the manufacturing method of the chip package 100 will be explained.

Figure 2:
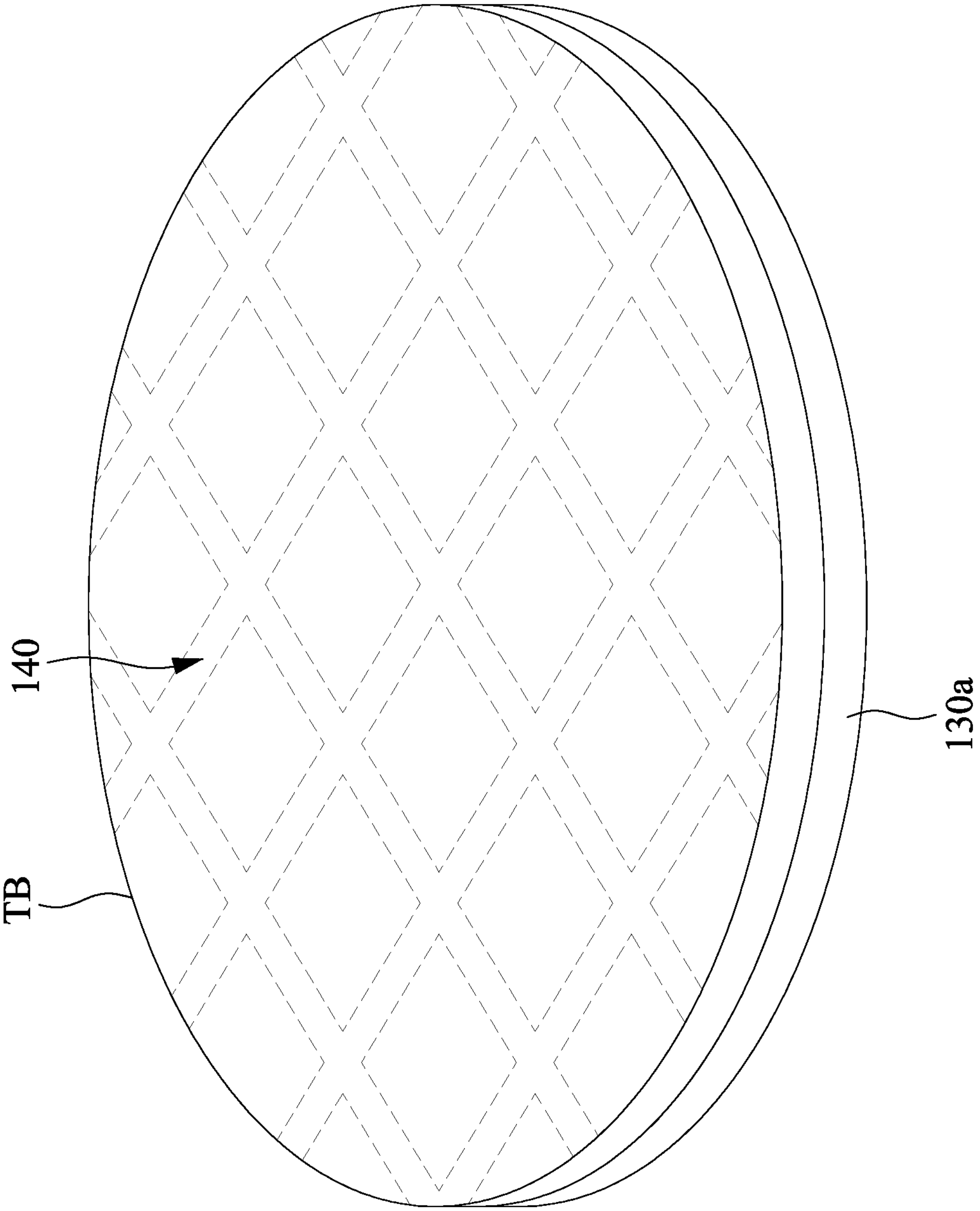
FIGS. 2 to 6 are cross-sectional views at intermediate stages of a manufacturing method of the chip package of FIG. 1.

FIGS. 2 to 6 are cross-sectional views at intermediate stages of the manufacturing method of the chip package 100 of FIG. 1. As shown in FIG. 2, the supporting element 140 having a grip shape is formed on a light transmissive sheet **130*a*, in which a cutting process is not performed on the light transmissive sheet 130*a* yet. Thereafter, a temporary bonding layer TB can be formed to cover the light transmissive sheet 130*a*, such that the light transmissive sheet 130*a* is located between the temporary bonding layer TB and the supporting element 140. For example, the temporary bonding layer TB is above the supporting element 140, and the light transmissive sheet 130*a* is below the supporting element 140**.

Figure 3:
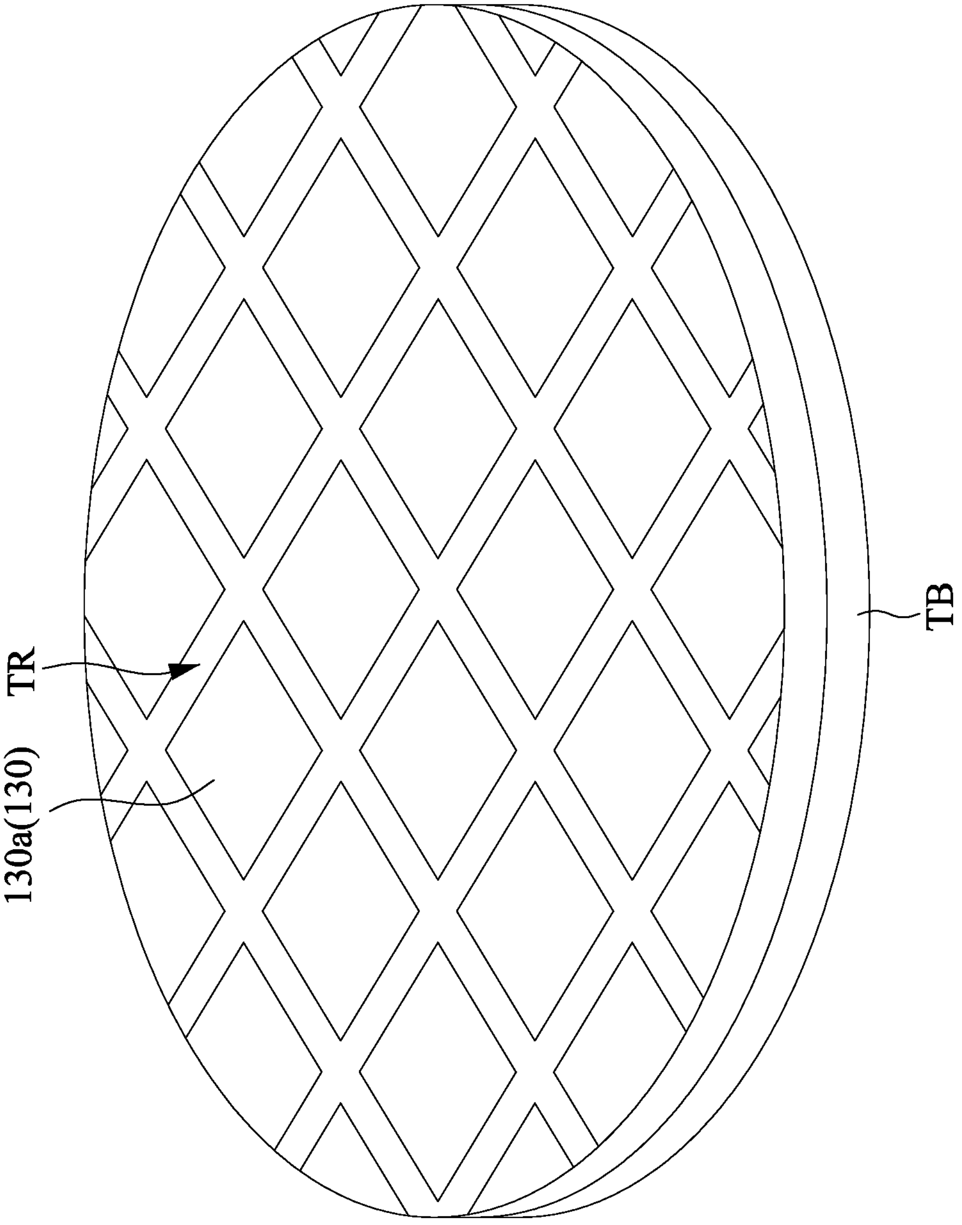

After the light transmissive sheet **130*a* is covered by the temporary bonding layer TB, the structure of FIG. 2 can be flipped. Thereafter, as shown in FIG. 3, the light transmissive sheet 130*a* and the supporting element 140 may be cut along the supporting element 140 to form a plurality of trenches TR. As a result, the light transmissive sheet 130*a* is cut to form plural light transmissive sheets 130. When the light transmissive sheet 130*a* and the supporting element 140 are cut at one time with the same cutting tool, the structure of the supporting element 140 and the light transmissive sheet 130 of FIG. 1 can be obtained, and thus the outer sidewall 141 of the supporting element 140 is aligned with the sidewall 131 of the light transmissive sheet 130** in the vertical direction.

Figure 4:
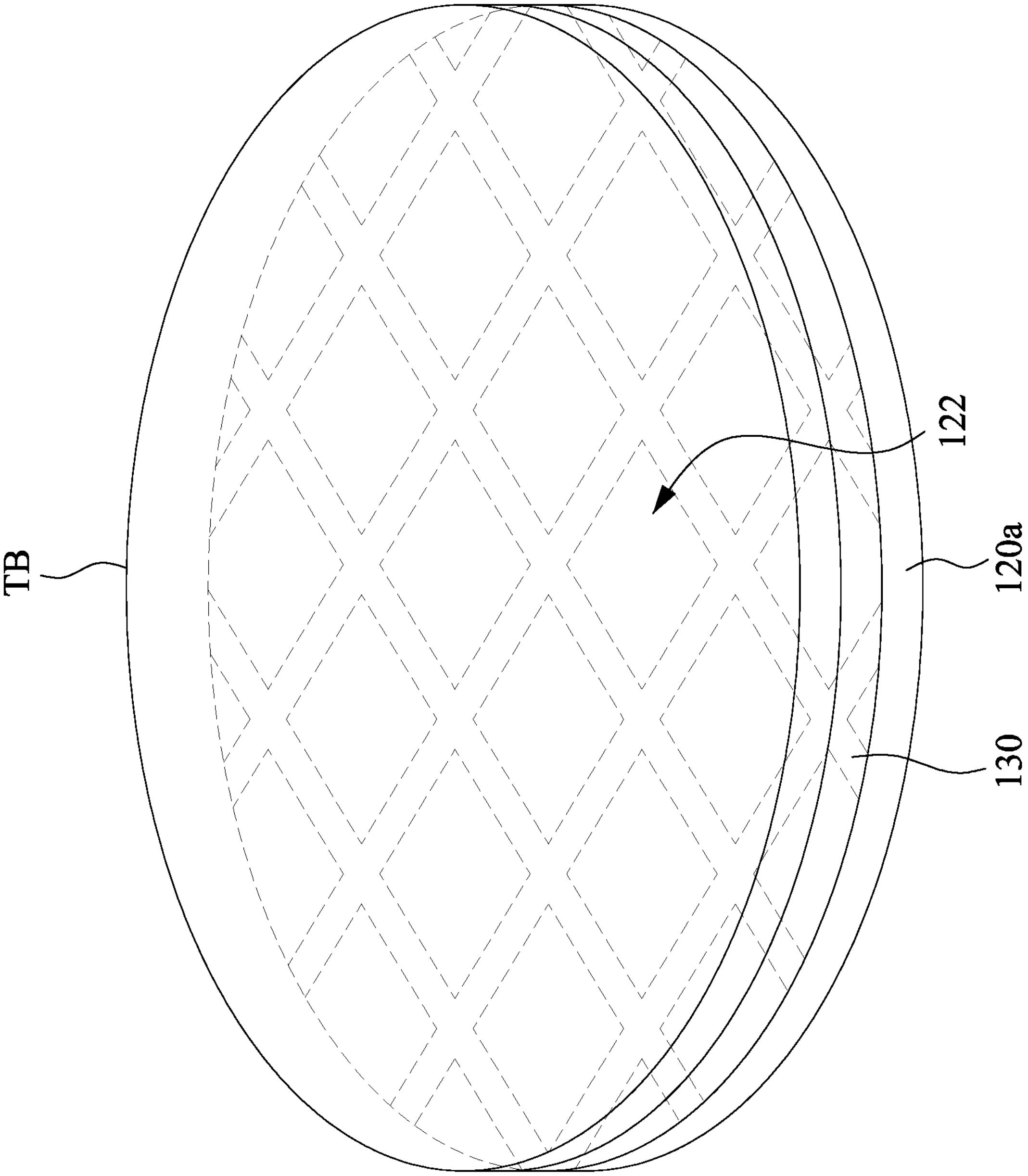

As shown in FIG. 4, after the trenches TR (see FIG. 3) are formed and before the supporting element 140 is bonded to a wafer **120*a*, the combination of the light transmissive sheet 130, the supporting element 140, and the temporary bonding layer TB can be flipped (i.e., the structure of FIG. 3 is flipped), such that the temporary bonding layer TB is above the light transmissive sheet 130, and the supporting element 140 is below the light transmissive sheet 130. Afterward, the supporting element 140 is bonded to the wafer 120*a* such that the supporting element 140 is located between the light transmissive sheet 130 and the wafer 120*a* and surrounds the sensing areas 122 of the wafer 120*a*. The wafer 120*a*** is a semiconductor structure which is not yet cut.

Figure 5:
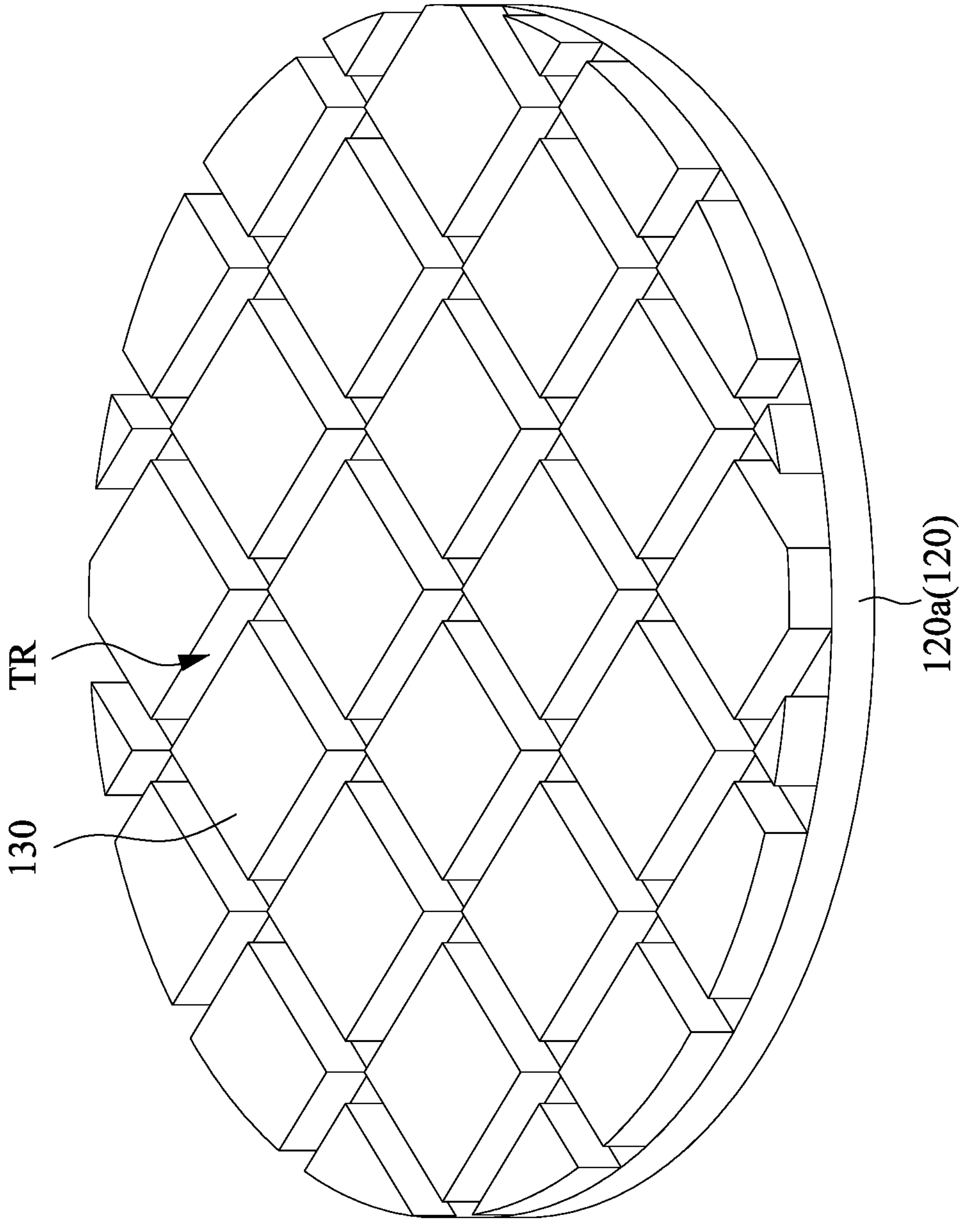

As shown in FIG. 5, after the supporting element 140 is bonded to the wafer **120*a*, the temporary bonding layer TB of FIG. 4 may be removed, and then the wafer 120*a* below the temporary bonding layer TB of FIG. 4 can be cut along the trenches TR to form the chips 120. After cutting the wafer 120*a*, plural structures of FIG. 6 can be obtained, while the structure of FIG. 6 is a stacked structure including the chip 120, the supporting element 140, and the light transmissive sheet 130 of FIG. 1**.

Figure 6:
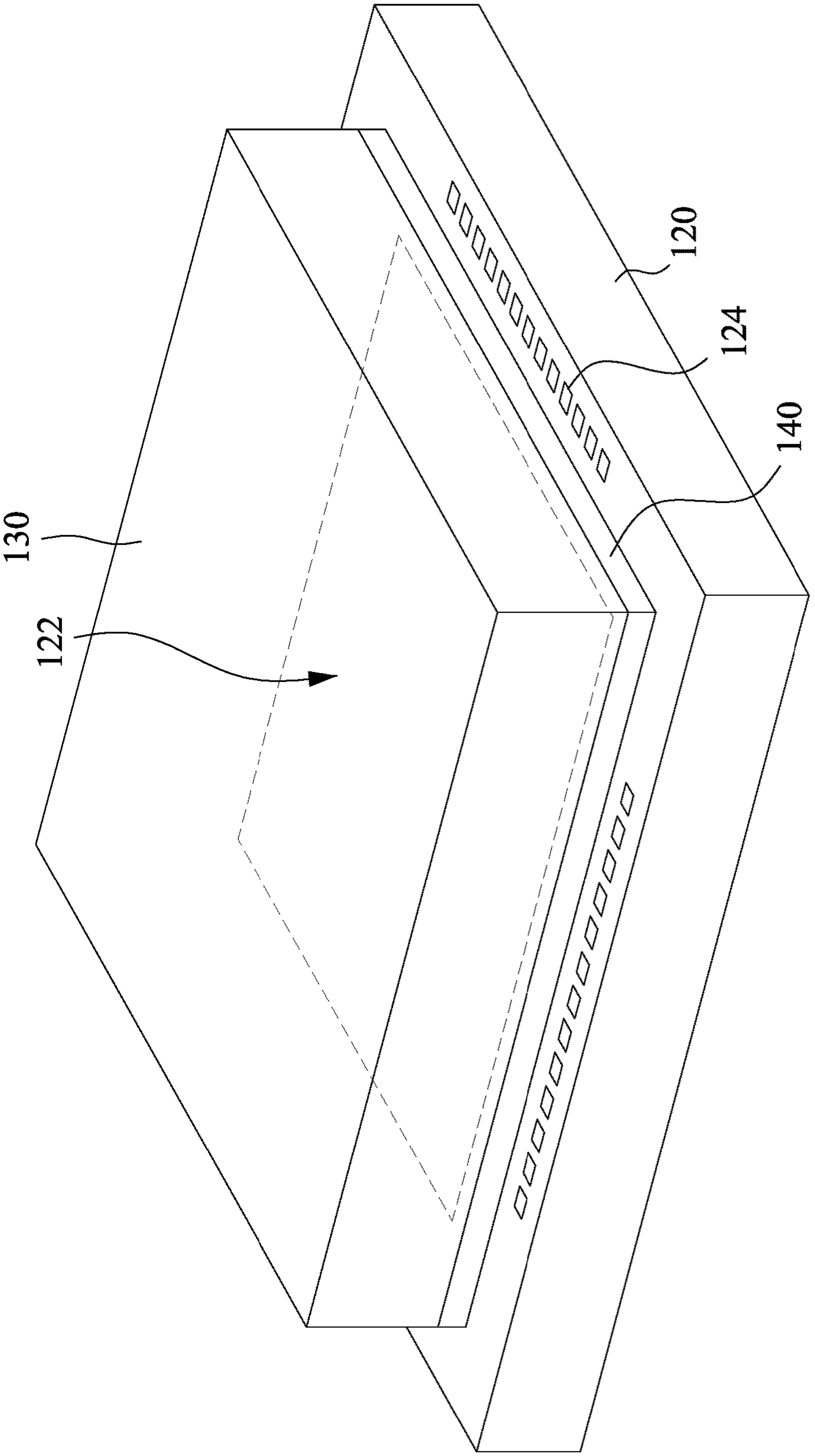

As shown in FIG. 6 and FIG. 1, in subsequent steps, the chip 120 may be bonded on the carrier board 110, and the molding material 150 is formed on the carrier board 110, such that the molding material 150 surrounds the chip 120 and the light transmissive sheet 130, and the top surface 152 of the molding material 150 is lower than the top surface 132 of the light transmissive sheet 130. Furthermore, forming the molding material 150 on the carrier board 110 is performed such that the top of the edge 151 of the molding material 150 is lower than the position of half the thickness H of the light transmissive sheet 130 (i.e., lower than the position of the dotted line L). After the chip 120 is bonded to the carrier board 110, the conductive wire W can electrically connect to the contact 124 of the chip 120 and the conductive pad 112 of the carrier board 110 by a wire bonding process. In addition, the conductive wire W is located in the molding material 150 after the molding material 150 is formed on the carrier board 110.

In the following description, other types of chip packages and manufacturing thereof will be explained.

Figure 7:
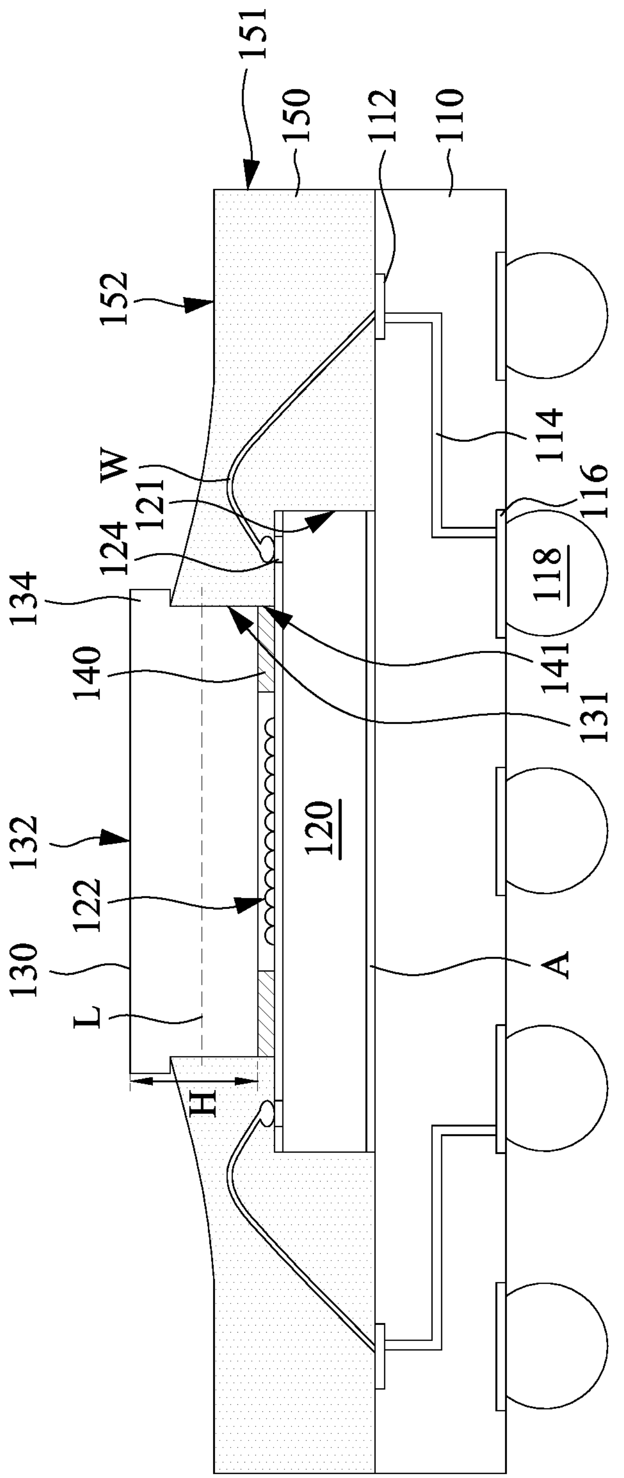
FIG. 7 is a cross-sectional view of a chip package according to one embodiment of the present disclosure.

FIG. 7 is a cross-sectional view of a chip package **100*a* according to one embodiment of the present disclosure. The chip package 100*a* includes the carrier board 110, the chip 120, the light transmissive sheet 130, the supporting element 140, and the molding material 150. The difference between this embodiment and the embodiment of FIG. 1 is that the sidewall 131 of the top portion of the light transmissive sheet 130 of the chip package 100*a* has a protruding portion 134 extending in a horizontal direction, and the molding material 150 extends to the bottom surface of the protruding portion 134. In the step of cutting the light transmissive sheet 130 and the supporting element 140 along the supporting element 140, a portion (e.g., the top half portion) of the light transmissive sheet 130 may be cut by a first cutting tool, and another portion (e.g., the bottom half portion) of the light transmissive sheet 130 and the supporting element 140, wherein the width of the second cutting tool is greater than the width of the first cutting tool, such that the sidewall 131 of the light transmissive sheet 130 has the protruding portion 134 extending in a horizontal direction. In such a configuration, when the molding material 150 is formed on the carrier board 110, the molding material 150 may extend to the bottom surface of the protruding portion 134 that is capable of limiting the position of the molding material 150**.

Figure 8:
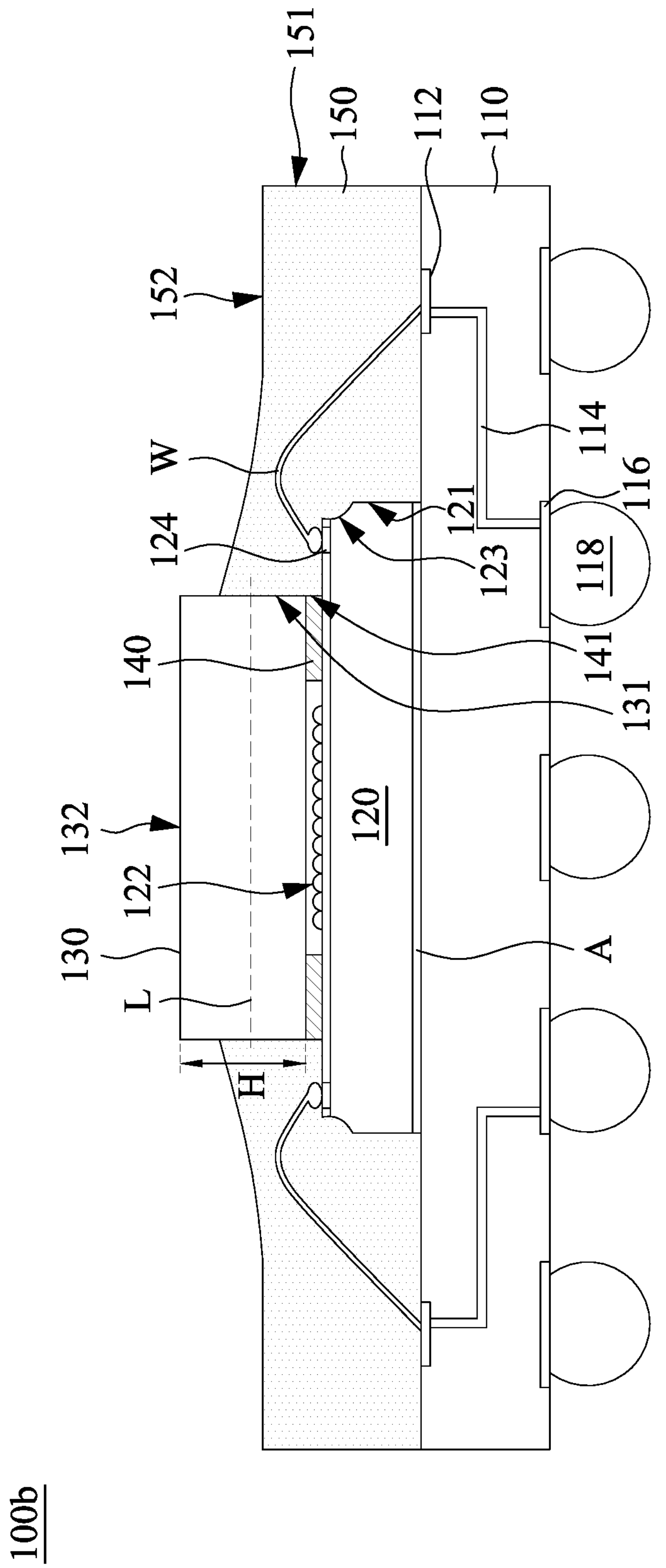
FIG. 8 is a cross-sectional view of a chip package according to one embodiment of the present disclosure.

FIG. 8 is a cross-sectional view of a chip package 100*b* according to one embodiment of the present disclosure. The chip package 100*b* includes the carrier board 110, the chip 120, the light transmissive sheet 130, the supporting element 140, and the molding material 150. The difference between this embodiment and the embodiment of FIG. 1 is that a corner of the top portion of the chip 120 of the chip package 100*b* has a concave portion 123, and the molding material 150 extends to the concave portion 123. In the step of cutting the wafer 120*a* along the trenches TR (see FIG. 5) to form the chips 120, the top portion of the wafer 120*a* may be cut by a first cutting tool, and the bottom portion of the wafer 120*a* may be cut by a second cutting tool, wherein the width of the second cutting tool is less than the width of the first cutting tool, such that the corner of the top portion of the chip 120 has the concave portion 123.

Figure 9:
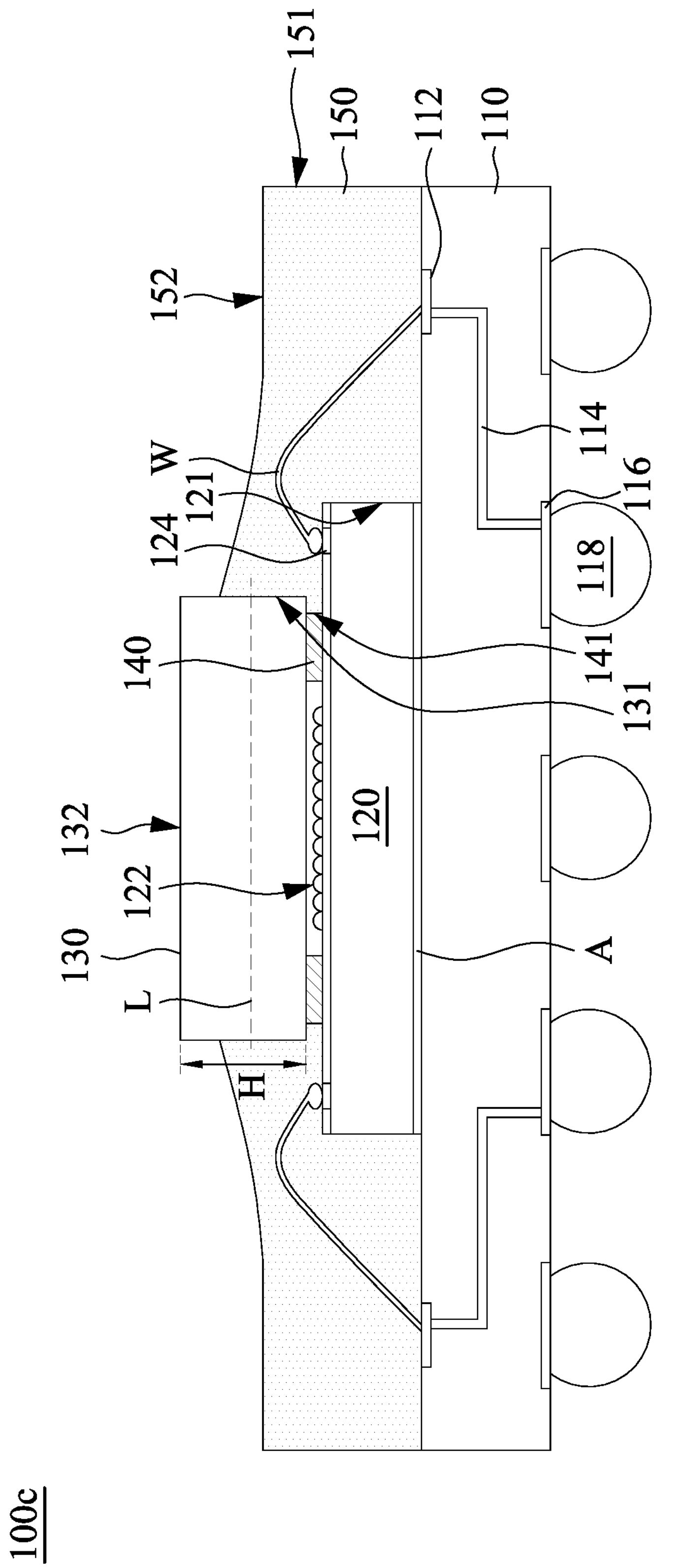
FIG. 9 is a cross-sectional view of a chip package according to one embodiment of the present disclosure.

FIG. 9 is a cross-sectional view of a chip package 100*c* according to one embodiment of the present disclosure. The chip package 100*c* includes the carrier board 110, the chip 120, the light transmissive sheet 130, the supporting element 140, and the molding material 150. The difference between this embodiment and the embodiment of FIG. 1 is that the outer sidewall 141 of the supporting element 140 of the chip package 100*c* is recessed in the sidewall 131 of the light transmissive sheet 130. In the step of cutting the light transmissive sheet 130 and the supporting element 140 along the supporting element 140, the light transmissive sheet 130 may be cut by a first cutting tool, and the supporting element 140 may be cut by a second cutting tool, wherein the width of the second cutting tool is greater than the width of the first cutting tool, such that the outer sidewall 141 of the supporting element 140 is recessed in the sidewall 131 of the light transmissive sheet 130.

Figure 10:
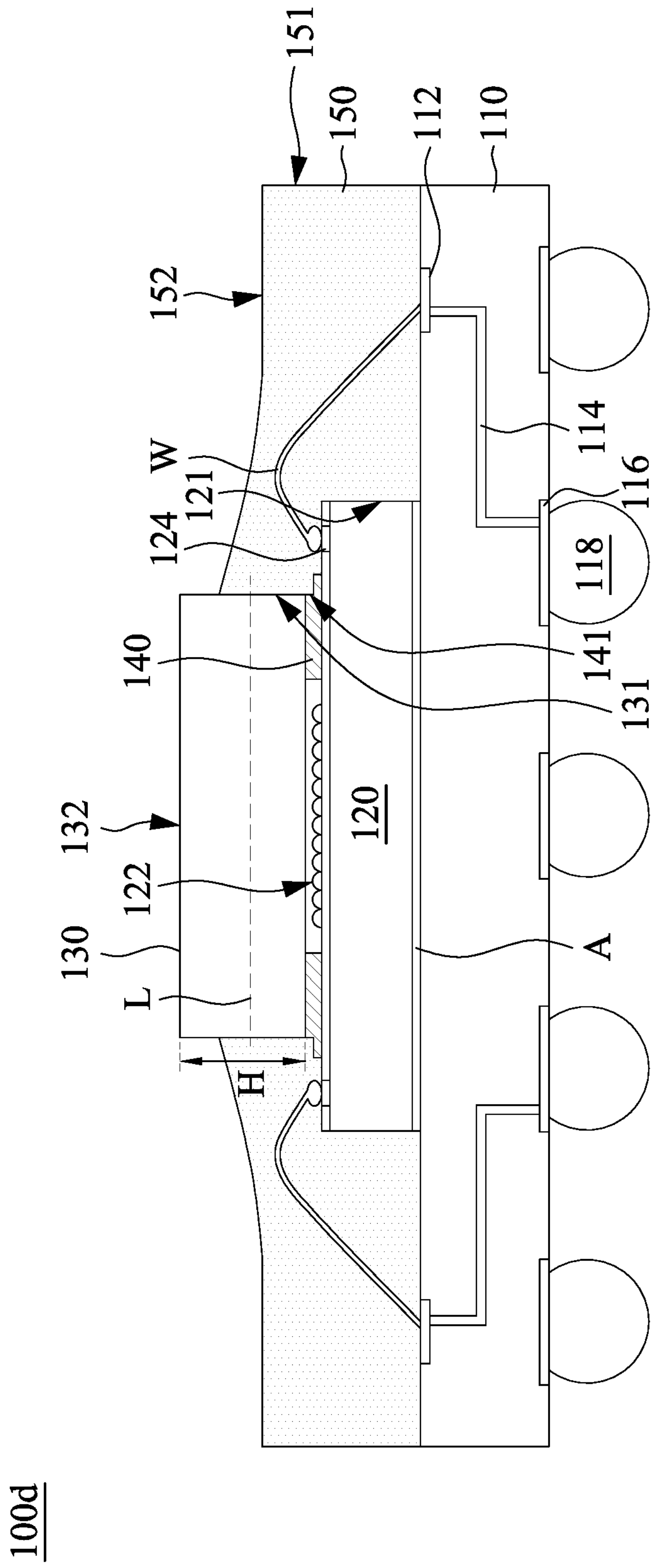
FIG. 10 is a cross-sectional view of a chip package according to one embodiment of the present disclosure.

FIG. 10 is a cross-sectional view of a chip package 100*d* according to one embodiment of the present disclosure. The chip package 100*d* includes the carrier board 110, the chip 120, the light transmissive sheet 130, the supporting element 140, and the molding material 150. The difference between this embodiment and the embodiment of FIG. 1 is that the top portion of the outer sidewall 141 of the supporting element 140 of the chip package 100*d* is aligned with the sidewall 131 of the light transmissive sheet 130 in a vertical direction, and the bottom portion of the outer sidewall 141 of the supporting element 140 protrudes from the sidewall 131 of the light transmissive sheet 130. In the step of cutting the light transmissive sheet 130 and the supporting element 140 along the supporting element 140, the light transmissive sheet 130 and a portion (e.g., the top half portion) of the supporting element 140 may be cut by a first cutting tool, and another portion (e.g., the bottom half portion) of the supporting element 140 may be cut by a second cutting tool, wherein the width of the second cutting tool is less than the width of the first cutting tool, such that the top portion of the outer sidewall 141 of the supporting element 140 is aligned with the sidewall 131 of the light transmissive sheet 130 in a vertical direction, and the bottom portion of the outer sidewall 141 of the supporting element 140 protrudes from the sidewall 131 of the light transmissive sheet 130.

Figure 11:
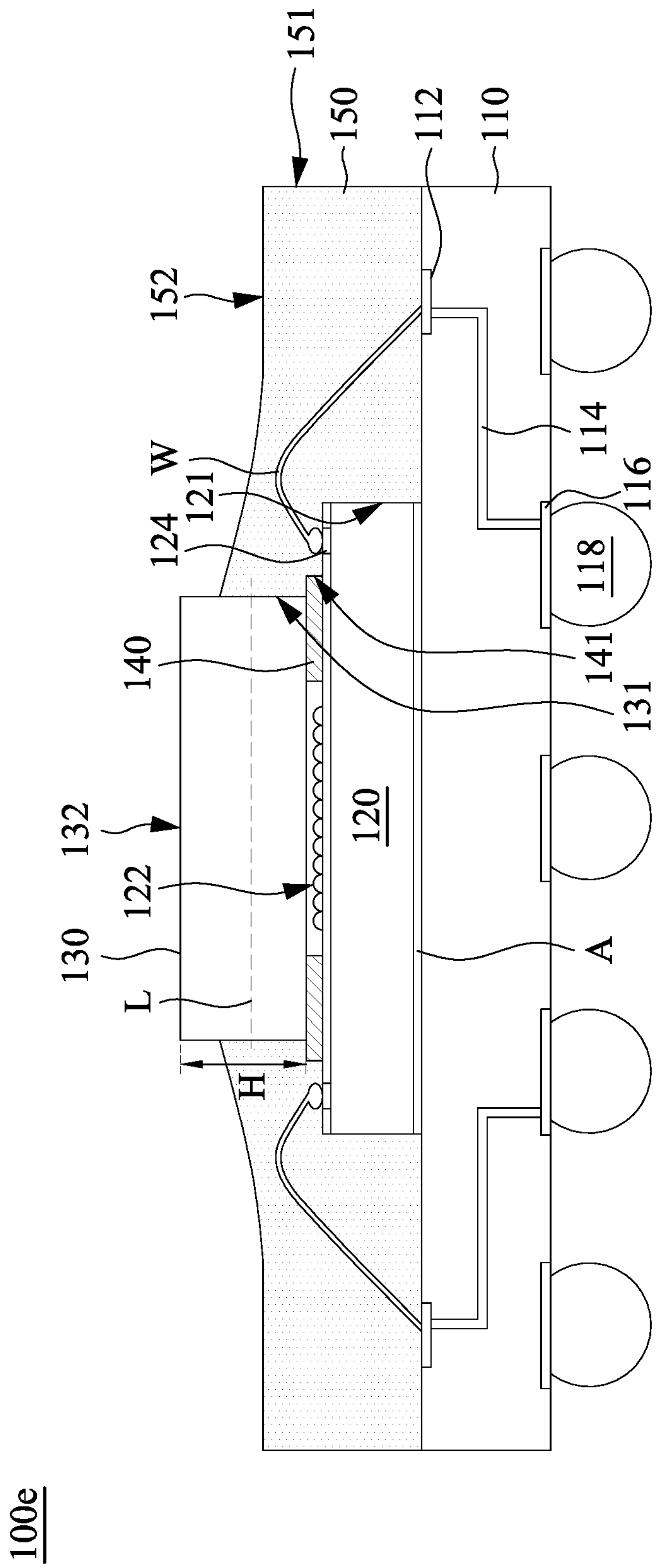
FIG. 11 is a cross-sectional view of a chip package according to one embodiment of the present disclosure.

FIG. 11 is a cross-sectional view of a chip package 100*e* according to one embodiment of the present disclosure. The chip package 100*e* includes the carrier board 110, the chip 120, the light transmissive sheet 130, the supporting element 140, and the molding material 150. The difference between this embodiment and the embodiment of FIG. 1 is that the entire outer sidewall 141 of the supporting element 140 of the chip package 100*e* protrudes from the sidewall 131 of the light transmissive sheet 130. In the step of cutting the light transmissive sheet 130 and the supporting element 140 along the supporting element 140, the light transmissive sheet 130 may be cut by a first cutting tool, and the supporting element 140 may be cut by a second cutting tool, wherein the width of the second cutting tool is less than the width of the first cutting tool, such that the entire outer sidewall 141 of the supporting element 140 protrudes from the sidewall 131 of the light transmissive sheet 130.

In summary, during the manufacturing method of the chip package, the light transmissive sheet 130 which is not yet cut is covered by the temporary bonding layer TB (see FIG. 2), and then the light transmissive sheet 130 and the supporting element 140 are cut along the supporting element 140, and then the supporting element 140 is bonded to the wafer 120*a* (see FIG. 4). Therefore, the wafer 120*a* can be cut along the trenches TR (see FIG. 5) to form the chips 120, thereby realizing wafer-level packaging for bonding the light transmissive sheet 130 to the chips 120. As a result, process time can be saved, and the sensing area 122 (see FIG. 6) of the chip 120 is prevented from being polluted to improve product yield. In a subsequent process, the chip 120 can be bonded to the carrier board 110 (see FIG. 1), and the amount of the molding material 150 (see FIG. 1) can be controlled to form on the carrier board 110 such that the top surface 152 of the molding material 150 is lower than the top surface 132 of the light transmissive sheet 130.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:

a carrier board;

a chip located on the carrier board and having a sensing area;

a light transmissive sheet covering the sensing area of the chip, wherein a sidewall of a top portion of the light transmissive sheet has a protruding portion extending in a horizontal direction;

a supporting element located between the light transmissive sheet and the chip and surrounding the sensing area of the chip, wherein the light transmissive sheet is located above the supporting element, and an outer sidewall of the supporting element is aligned with a sidewall of the light transmissive sheet in a vertical direction; and a molding material located on the carrier board and surrounding the chip and the light transmissive sheet, wherein a top surface of the molding material is lower than a top surface of the light transmissive sheet, and the entire molding material is located below the protruding portion of the light transmissive sheet.

2. The chip package of claim 1, wherein a top of an edge of the molding material is lower than a position of half a thickness of the light transmissive sheet.

3. The chip package of claim 1, wherein a thickness of the light transmissive sheet is in a range from 50 μm to 1000 μm, and a thickness of the supporting element is in a range from 40 μm to 250 μm.

4. The chip package of claim 1, wherein a corner of a top portion of the chip has a concave portion, and the molding material extends to the concave portion.

5. A chip package, comprising:

a carrier board;

a chip located on the carrier board and having a sensing area;

a light transmissive sheet covering the sensing area of the chip, wherein a sidewall of a top portion of the light transmissive sheet has a protruding portion extending in a horizontal direction;

a supporting element located between the light transmissive sheet and the chip and surrounding the sensing area of the chip, wherein the light transmissive sheet is located above the supporting element; and a molding material located on the carrier board and surrounding the chip and the light transmissive sheet, wherein a top surface of the molding material is lower than a top surface of the light transmissive sheet, the molding material extends to a bottom surface of the protruding portion, and the entire molding material is located below the protruding portion of the light transmissive sheet.

6. The chip package of claim 1, wherein a top portion of the outer sidewall of the supporting element is aligned with the sidewall of the light transmissive sheet in the vertical direction, and a bottom portion of the outer sidewall of the supporting element protrudes from the sidewall of the light transmissive sheet.

7. The chip package of claim 1, wherein the carrier board has a conductive pad, the chip has a contact electrically connected to the conductive pad of the carrier board by a conductive wire, and the conductive wire is located in the molding material.

8. The chip package of claim 5, wherein an outer sidewall of the supporting element is aligned with a sidewall of the light transmissive sheet in a vertical direction.

9. A manufacturing method of a chip package, comprising:

forming a supporting element having a grip shape on a light transmissive sheet;

forming a temporary bonding layer covering the light transmissive sheet;

cutting the light transmissive sheet and the supporting element along the supporting element to form a plurality of trenches, such that a sidewall of a top portion of the light transmissive sheet has a protruding portion extending in a horizontal direction, and an outer sidewall of the supporting element is aligned with a sidewall of the light transmissive sheet in a vertical direction;

bonding the supporting element to a wafer such that the supporting element is located between the light transmissive sheet and the wafer and surrounds a plurality of sensing areas of the wafer;

removing the temporary bonding layer;

cutting the wafer along the trenches to form a plurality of chips;

bonding one of the chips on a carrier board; and forming a molding material on the carrier board, wherein the molding material surrounds said chip on the carrier board and the light transmissive sheet, and a top surface of the molding material is lower than a top surface of the light transmissive sheet, and the entire molding material is located below the protruding portion of the light transmissive sheet.

10. The manufacturing method of the chip package of claim 9, wherein forming the molding material on the carrier board is performed such that a top of an edge of the molding material is lower than a position of half a thickness of the light transmissive sheet.

11. The manufacturing method of the chip package of claim 9, further comprising:

flipping a combination of the light transmissive sheet, the supporting element, and the temporary bonding layer after the trenches is formed and before the supporting element is bonded to the wafer, such that the temporary bonding layer is above the light transmissive sheet, and the supporting element is below the light transmissive sheet.

12. The manufacturing method of the chip package of claim 9, wherein cutting the light transmissive sheet and the supporting element along the supporting element comprises:

cutting, by a first cutting tool, a portion of the light transmissive sheet; and cutting, by a second cutting tool, another portion of the light transmissive sheet and the supporting element, wherein a width of the second cutting tool is greater than a width of the first cutting tool.

13. The manufacturing method of the chip package of claim 12, wherein forming the molding material on the carrier board is performed such that the molding material extends to a bottom surface of the protruding portion.

14. The manufacturing method of the chip package of claim 9, wherein cutting the wafer along the trenches to form the chips comprises:

cutting, by a first cutting tool, a top portion of the wafer; and cutting, by a second cutting tool, a bottom portion of the wafer, wherein a width of the second cutting tool is less than a width of the first cutting tool, such that a corner of a top portion of each of the chips has a concave portion.

15. The manufacturing method of the chip package of claim 9, wherein cutting the light transmissive sheet and the supporting element along the supporting element comprises:

cutting, by a first cutting tool, the light transmissive sheet and a portion of the supporting element; and cutting, by a second cutting tool, another portion of the supporting element, wherein a width of the second cutting tool is less than a width of the first cutting tool, such that a top portion of the outer sidewall of the supporting element is aligned with the sidewall of the light transmissive sheet in the vertical direction, and a bottom portion of the outer sidewall of the supporting element protrudes from the sidewall of the light transmissive sheet.

16. The manufacturing method of the chip package of claim 9, further comprising:

after bonding one of the chips on the carrier board, electrically connecting a conductive wire to a contact of the chip on the carrier board and a conductive pad of the carrier board by wire bonding, wherein after the molding material is formed on the carrier board, the conductive wire is located in the molding material.

* * * * *